United States Patent [19]
Weinstein et al.

[11] Patent Number: 5,208,786
[45] Date of Patent: May 4, 1993

[54] MULTI-CHANNEL SIGNAL SEPARATION

[75] Inventors: Ehud Weinstein, Ramat-gam; Meir Feder, Herzliya, both of Israel; Alan V. Oppenheim, Lexington, Mass.

[73] Assignee: Massachusetts Institute of Technology, Cambridge, Mass.

[21] Appl. No.: 750,917

[22] Filed: Aug. 28, 1991

[51] Int. Cl.⁵ .................................................. G01S 15/00
[52] U.S. Cl. ....................................... 367/124; 367/901; 367/125; 367/126
[58] Field of Search ................ 367/901, 135, 125, 124, 367/126; 364/574, 517, 724.19, 724.17, 724.03; 381/94, 71; 455/278, 283

[56] References Cited

U.S. PATENT DOCUMENTS

| | | | |
|---|---|---|---|
| 3,935,574 | 1/1976 | Pentheroudakis | 364/517 |
| 4,283,795 | 8/1981 | Steinberger | 455/283 |
| 4,320,535 | 3/1982 | Brady et al. | 455/278 |
| 4,473,906 | 9/1984 | Warnaka et al. | 367/901 |

OTHER PUBLICATIONS

Widrow et al., "Adaptive Noise Canceling: Principles and Applications," *Proc. IEEE*, 63:1692–1716, 1975.

Primary Examiner—Daniel T. Pihulic
Attorney, Agent, or Firm—Hamilton, Brook, Smith & Reynolds

[57] ABSTRACT

A system separates unknown signals which have been combined together through unknown linear filters and for which observations at multiple sensors are made. In a two channel circuit with two inputs and two sensors, the reconstructed source signals are assumed to be decorrelated such that the cross-correlation between the reconstructed source signals is near zero. The transfer functions which represent the crosstalk processes are estimated. The output signals are detected and the transfer functions are recursively solved. A reconstruction filter is used to recover the original input signals.

44 Claims, 9 Drawing Sheets

MULTI-CHANNEL SIGNAL SEPARATION

GOVERNMENT SUPPORT

The invention described herein was supported in whole or in part by Grant No. N00014-89-J-1489 from DARPA, Grant No. MDA904-89-C-3009 from MPO, and Grant No. N00014-90-J-1109 from ONR.

BACKGROUND OF THE INVENTION

In a variety of contexts, observations are made of the outputs of an unknown multiple-input multiple-output linear system, from which it is of interest to recover the input signals. For example, in problems of enhancing speech in the presence of background noise, or separating competing speakers, multiple microphone measurements will typically have components from both sources with the linear system representing the effect of the acoustic environment.

Considering specifically the two-channel case, it is desired to estimate the two source signals $s_1$ and $s_2$, from the observation of the two output signals $y_1$ and $y_2$. In many applications one of the signals, $s_1$, is the desired signal, while the other signal, $s_2$, is the interference or noise signal. Both desired and noise signals are coupled through the unknown system to form the observed signals.

The most widely used approach to noise cancellation, in the two channel case, was suggested by Widrow et al. in "Adaptive Noise Canceling: Principles and Applications", *Proc. IEEE*, 63:1692–1716, which was published in 1975. In this approach, it is assumed that one of the observed signals, $y_1$—the primary signal, contains both the desired signal and an uncorrelated interfering signal, while the other observed signal, $y_2$—the reference signal, contains only the interference. The system that coupled the reference signal into the primary signal is found using the least mean square (LMS) algorithm. Then, the reference signal is filtered by the estimated system and subtracted from the primary signal to yield an estimate of the desired signal, $s_1$. For example, U.S. Pat. No. 4,473,906 issued to Warnaka et al. used Widrow's approach and assumptions in an acoustic cancellation structure.

The main drawback of Widrow's approach lies in the crucial assumption that the reference signal is uncorrelated with the primary signal. This assumption is not realized in practice due to leakage of the primary signal into the reference signal. This degrades the performance of Widrow's method. Depending on the leakage (or cross-talk) power, this degradation may be severe, leading to a reverberant quality in the reconstructed signal since a portion of the desired signal is also subtracted, out of phase, together with the interference signal. Thus, a method of reconstruction is needed that can operate without making the unrealistic no-leakage assumption.

SUMMARY OF THE INVENTION

The invention proposes an approach to estimate a plurality of input source signals, which passed through an unknown multiple-input multiple-output system, from observations of the output signals. It suggests, in fact, a solution of the problem of signal separation from their coupled observations. In the two channel case, the invention suggests an approach to estimate the desired signal (i.e., to cancel the interfering signal) or to estimate both source signals, in the more realistic scenario where both signals are coupled into the observed signals, and thereby overcoming the main drawback of the previous techniques.

The invention comprises a signal processing system including a plurality of detectors for receiving plural observed signals, which, as mentioned above, results from plural source signals subjected to an unknown transfer function. A processor receives the observed signals and estimates the components of the transfer function, which are used to produce a filter (for example, but not necessarily, an inverse filter) for reconstructing the input source signals. The criterion for the estimate, or for the production of the reconstruction filter, is that the reconstructed source signals are uncorrelated. No assumption is made about the observed signals. Decorrelating the reconstructed signals implies that the source signals, which became correlated in the observation due to coupling, are separated at reconstruction.

In the two channel case, the original source signals are denoted $s_a$ and $s_b$, the separation system will only reconstruct $s_1$ and $s_2$, representing the separated source signals processed by the filters. In this two channel case, when the reconstructing filter is an inverse filter, i.e., its response is the inverse of the system response, the first observed signal, $y_1$, is passed through a filter $H_{21}$ (which is an estimate of the system $H_{21}$ that couples $s_1$ into $y_2$), to yield a signal $v_1$. The other observed signal $y_2$ is passed through a filter $H_{12}$ (which is an estimate of the system $H_{12}$ that couples $s_2$ into $y_1$), to yield a signal $v_2$. Then $v_1$ is subtracted from $y_2$, $v_2$ is subtracted from $y_1$ and each of the resulting difference signals is passed through another system $1/G$, to yield the reconstructed source signals $s_1$ and $s_2$. The components of the reconstruction filter, $H_{12}$, $H_{21}$ and $1/G$ are estimated from the observed data so that the reconstructed signals are decorrelated. When it is assumed that the coupling system $H_{21}$ is zero, and its estimate is forced to be zero, the standard Widrow's method results. By assuming decorrelated reconstructed outputs, no assumption need be made regarding the observed signal. If one transfer component of the reconstruction filter is known, then the other transfer component can be estimated. This criterion can be used with several other assumptions. For example, the generating system transfer components $H_{12}$ and $H_{21}$ can have finite impulse responses which have finite lengths. Then, the inverse filter for the generating system can be calculated to determine the reconstruction filter.

In another embodiment, the reconstruction filter can have a finite impulse response. If either $H_{21}$ or $H_{12}$ are known, then the other can be calculated and reconstructed output signals developed. Also, only partial knowledge of the transfer components is needed to accurately calculate the reconstruction filter.

In the preferred embodiment, it is assumed that the generating system transfer function is an FIR filter; thus, the coupling system $H_{12}$ and $H_{21}$ have a finite impulse response (FIR). In other words, the coupling filters can be represented as tapped delay lines, where each delay segment is multiplied by a filter coefficient and all the outcomes are summed to yield the filter output. The estimate of the coupling FIR system is performed via an iterative process. The processor alternately solves for the coefficients of one system, assuming that the other system is known.

A similar procedure and embodiment is obtained when the reconstruction filter is forced to be an FIR system.

In another related embodiment, the processor that determined the unknown transfer functions and produces the reconstruction filter (e.g., the inverse filter) is adaptive. The processor updates the components of the transfer function as more data is available, and based on the previous estimate of the input source signals. This embodiment represents a class of possible algorithms of various methods for sequential updating of the parameters.

One application of the invention would be in a signal enhancing scenario in a room. The first (primary) microphone is close to the speaker and the other (reference) microphone is close to the noise source. However, the microphones need not be close to the sources. The first microphone detects the desired speech signal with some noise, and the second microphone detects mainly the noise with some speech language. The coupling is due to the unknown acoustic room environment. The processor of the invention is used to reconstruct the desired speech signal without the interfering noise. When the second signal source is another speaker, the processor of the invention separates both speech signals from the detected microphone signals that contain their coupled measurements. In the context of speech signals, the invention processor, for example, can be used as a front-end in automatic speech recognition systems operating in noisy environments, or when there is a cross-talk from an interfering speaker.

Although the preferred embodiment operates for speech signal in an acoustic environment, the system for multi-channel signal separation can be applied to many different areas. For example, a 60 Hz interference from electrocardiogram can be deleted, even in cases when the reference contains some of the desired signal. Other applications may include cancellation of noise signals in telemetry system. Also, interfering signals in an antenna system can be cancelled using the proposed algorithm.

The above and other features of the invention including various novel details of construction and combinations of parts will now be more particularly described with reference to the accompanying drawings and pointed out in the claims. It will be understood that the particular choice embodying the invention is shown by way of illustration only and not as a limitation of the invention. The principles and features of this invention may be employed in various and numerous embodiments without departing from the scope of the invention.

DETAILED DESCRIPTION OF THE INVENTION

Figure 1:
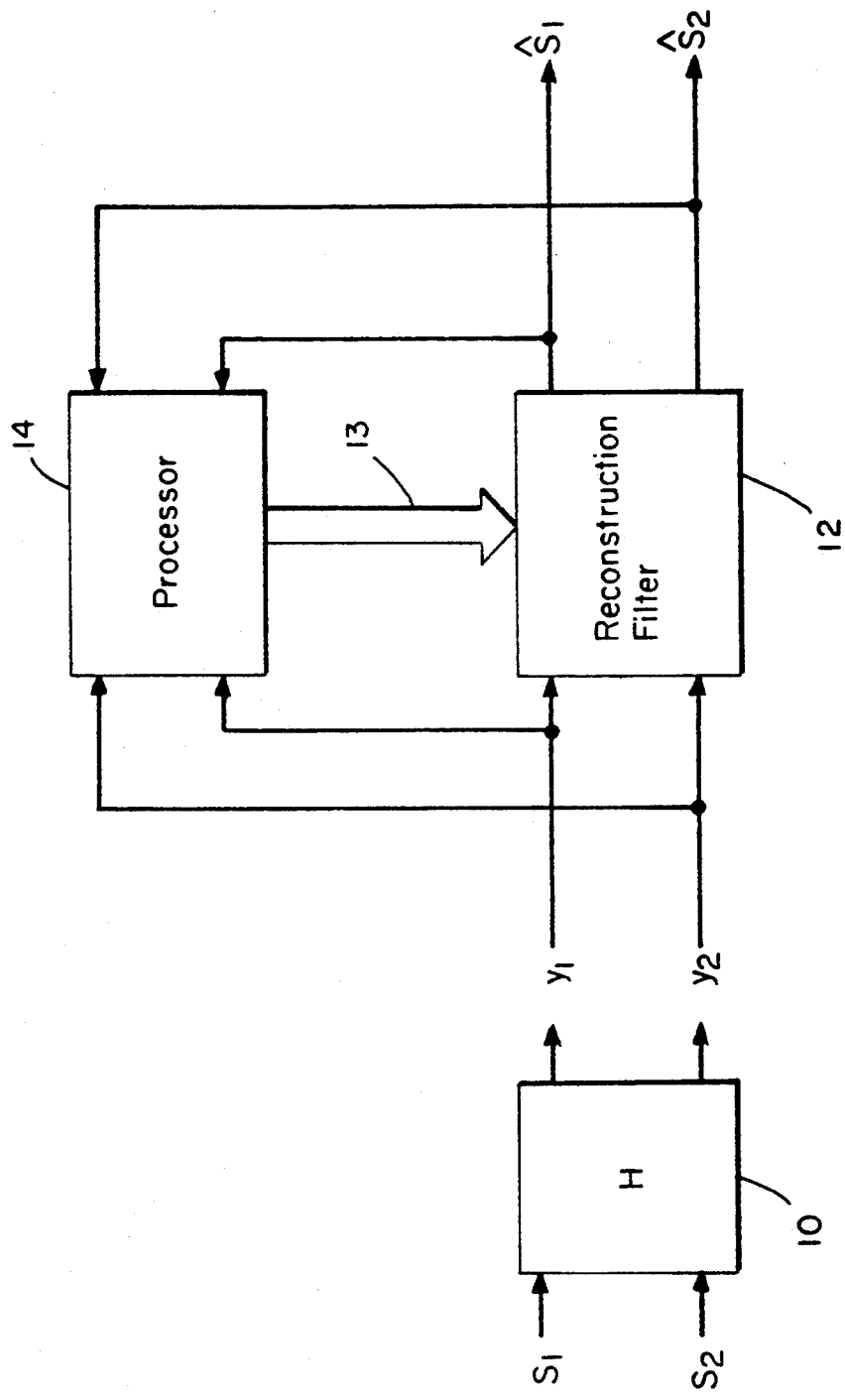
FIG. 1 is a schematic illustration of a general signal processing system embodying the present invention.
Figure 2:
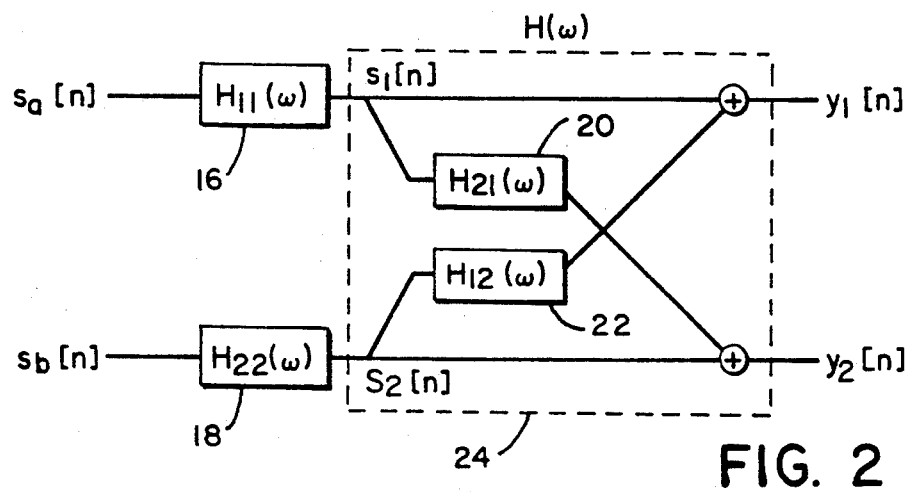
FIG. 2 illustrates a general two channel system where $H_{11}$, $H_{12}$, $H_{21}$ and $H_{22}$ represent the transfer functions of four single-input single-output systems.

FIG. 1 illustrates schematically the operation of the signal separator of the invention. Two signals, $s_1$ and $s_2$, are processed by an environment 10 which is represented by a transfer function H. FIG. 2 shows the transfer function H in more detail. The transfer function H produces output signals $y_1$ and $y_2$. The output signal $y_1$ comprises the signal $s_1$ and a filtered version of signal $s_2$. The output signal $y_2$ comprises the signal $s_2$ and a filtered version of signal $s_1$. Thus, the environment 10 represented by transfer function H produces signal leakage or cross talk in both output signals $y_1$ and $y_2$. The processor 14 and the reconstruction filter 12 operate under the criterion that the reconstructed source signals, $s_1$ and $s_2$, are uncorrelated.

Processor 14 recursively operates on the values of detected output signals, $y_1$ and $y_2$, and reconstructed source signals, $s_1$ and $s_2$, to produce an output 13 which updates the system components of reconstruction filter 12. Thus, crosstalk in the detected output signals, $y_1$ and $y_2$, is compensated and the reconstructed source signals, $s_1$ and $s_2$, converge to the actual values of signals $s_1$ and $s_2$, respectively. A detailed explanation of this process is recited below.

A general two-channel linear time invariant (LTI) system can be represented in the form shown in FIG. 2, where $H_{11}(w)$, $H_{12}(w)$, $H_{21}(w)$, and $H_{22}(w)$ represent the transfer functions of four single-input single-output LTI systems. Thus, FIG. 2 illustrates the environment of $H(w)$ that is used to develop the inverse transfer function $H^{-1}(w)$ which is required to reconstruct signal sources $s_1(n)$ and $s_2(n)$. The problem specifically considers estimating $s_1[n]$, $s_2[n]$, $H_{12}(\omega)$, and $H_{21}(\omega)$. In some scenarios, such as when one sensor is close to each of the signal sources $s_a[n]$ and $s_b[n]$, it is appropriate to assume $H_{11}(w)=H_{22}(w)=1$. In other scenarios, when this is not the case, then the formulation is still directed at separation of $s_1[n]$ and $s_2[n]$, but not full recovery of the input signals. In many cases this may still be an acceptable objective. For example, if either $s_a[n]$ and $s_b[n]$ or both are speech, for a wide class of transfer functions $H_{11}(w)$ and $H_{22}(w)$ separation of $s_1[n]$ and $s_2[n]$ from $y_1[n]$ and $y_2[n]$ is sufficient for intelligibility. Also, assume that $H_{12}(w)$ and $H_{21}(w)$ are stable LTI systems, and denote their unit sample responses by $h_{12}[n]$ and $h_{21}[n]$ respectively. Consequently, $$y_1[n]=s_1[n]+h_{12}[n]*s_2[n] \tag{1}$$

$$y_2[n]=s_2[n]+h_{21}[n]*s_1[n] \tag{2}$$

where * denotes convolution. We further assume that $$H_{12}(\omega)H_{21}(\omega)\neq 1 \quad -\pi<\omega<\pi \tag{3}$$

The signals $s_n[n]$ and $s_2[n]$ are considered to be sample functions from stochastic processes having stationary covariance functions. For notational simplicity, it is assumed that $s_1[n]$ and $s_2[n]$ are zero means. Consequently the auto-covariances and cross-covariances are given by $$r_{11}[k] \triangleq E\{s_1[n]s_1^*[n-k]\} \quad (4a)$$

$$r_{22}[k] \triangleq E\{s_2[n]s_2^*[n-k]\} \quad (4b)$$

$$r_{12}[k] \triangleq E\{s_1[n]s_2^*[n-k]\} \quad (4c)$$

where $E\{.\}$ denotes expected value. The corresponding power spectra will be denoted as $P_{s1s1}(\omega)$, $P_{s2s2}(\omega)$, and $P_{s1s2}(\omega)$ respectively. It should be stressed that the zero means assumption is not necessary and the derivation and results apply equally to the more general case of non-zero and time-varying means values, since they are phrased in terms of covariance.

The desired approach comprises developing estimates of a $s_1[n]$, $s_2[n]$, and the linear systems $H_{12}(\omega)$ and $H_{21}(\omega)$ subject to satisfying the model of Equations (1) and (2), the additional assumption of Equation (3), and appropriate constraints on $P_{s1s1}(\omega)$, $P_{s2s2}(\omega)$, and $P_{s1s2}(\omega)$.

From Equations (1) and (2) or FIG. 2, the transfer function matrix $H(w)$ is $$H(\omega) = \begin{bmatrix} 1 & H_{12}(\omega) \\ H_{21}(\omega) & 1 \end{bmatrix} \quad (5)$$

and correspondingly the transfer function of the inverse system is $$H^{-1}(\omega) = \frac{1}{1 - H_{12}(\omega)H_{21}(\omega)} \begin{bmatrix} 1 & -H_{12}(\omega) \\ -H_{21}(\omega) & 1 \end{bmatrix} \quad (6)$$

which is stable under the condition of Equation (3).

From (6) and the well-known relationship for power spectra at the input and output of LTI systems, we can write that $$|1-H_{12}(\omega)H_{21}(\omega)|^2 P_{s1s2}(\omega) = P_{y1y2}(\omega) - H_{12}(\omega)P_{y1y2}(\omega) - H_{21}^*(\omega)P_{y1y1}(\omega) + H_{12}(\omega)H_{21}^*(\omega)P_{y1y2}(\omega) \quad (7a)$$

$$|1-H_{12}(\omega)H_{21}(\omega)|^2 P_{s1s1}(\omega) = P_{y1y1}(\omega) - H_{12}(\omega)P_{y2y1}(\omega) - H_{12}^*(\omega)P_{y1y2}(\omega) + H_{12}(\omega)H_{12}^*(\omega)P_{y2y2}(\omega) \quad (7b)$$

$$|1-H_{12}(\omega)H_{21}(\omega)|^2 P_{s2s2}(\omega) = P_{y1y2}(\omega) - H_{21}(\omega)P_{y1y2}(\omega) - H_{21}^*(\omega)P_{y1y2}(\omega) + H_{21}(\omega)H_{21}^*(\omega)P_{y1y2}(\omega) \quad (7c)$$

If $P_{s1s1}(\omega)$, $P_{s2s2}(\omega)$, and $P_{s1s2}(\omega)$ are known, estimates of $H_{12}(\omega)$, $H_{21}(\omega)$, $s_1[n]$, and $s_2[n]$ consistent with Equations (7) and the model of Equation (1) are determined. However, the source power spectra are generally not known, so Equation (7) has too many variables to be solved.

I. Estimation Based on Decorrelation

It has been determined that Equation 7(a) can be readily solved by assuming that $P_{s1s2}(\omega)=0$. By assuming that $P_{s1s2}(\omega)=0$, i.e. that $s1$ and $s2$ are not correlated, either $H_{12}$ or $H_{21}$ can be determined in terms of the power spectra for detected signals $y1$ and $y2$ and the estimate for the other transfer function component exists. Thus, an adequate number of unknowns are eliminated from Equation 7(a) to permit its solution.

Estimates of $s_1[n]$, $s_2[n]$ and the linear systems $H_{12}(\omega)$ and $H_{21}(\omega)$ to satisfy the model of Equations (1) and (2) and the constraint that $P_{s1s2}(\omega)=0$ are determined recursively. Specifically, $H_{12}(\omega)$ and $H_{21}(\omega)$, estimates of $H_{12}(\omega)$ and $H_{12}(\omega)$, are chosen to satisfy (7a) with $P_{s1s2}(\omega)=0$, i.e.

$$P_{y1y2}(\omega) - H_{12}(\omega)P_{y2y2}(\omega) - H_{21}^*(\omega)P_{y1y1}(\omega) + H_{12}(\omega)H_{21}^*(\omega)P_{y1y2}^*(\omega) = 0 \quad (8)$$

where $P_{y1y2}(\omega)$, $P_{y2y2}(\omega)$, and $P_{y1y1}(\omega)$ are estimated from the observed data.

The estimates $s_1[n]$ and $s_2[n]$ are then obtained by applying to the data the inverse filter $H^{-1}(\omega)$ given by $$\hat{H}^{-1}(\omega) = \frac{1}{1 - \hat{H}_{12}(\omega)\hat{H}_{21}(\omega)} \begin{bmatrix} 1 & -\hat{H}_{12}(\omega) \\ -\hat{H}_{21}(\omega) & 1 \end{bmatrix} \quad (9)$$

Referring to the embodiment of FIG. 1, processor 14 estimates a first system cross component, generates the second system cross component to satisfy Equation (8), and then $s_1$ and $s_2$ are generated by the reconstruction filter, using an inverse filter.

Clearly, Equation (8) does not specify a unique solution for both $H_{12}(\omega)$ and $H_{21}(\omega)$ and any solution will result in estimates of $s_1[n]$ and $s_2[n]$ which satisfy the decorrelation condition. Several specific approaches which further constrain the problem to eliminate this ambiguity are discussed in Section II.

If one of the transfer function components $H_{12}(\omega)$, $H_{21}(\omega)$ is known, the other can be solved for easily using Equation (8). For example, one straightforward constraint which leads to a unique solution of (8) and unique estimates of $s_1[n]$ and $s_2[n]$ results from having $H_{21}(\omega)$ specified. In this case, $$H_{12}(\omega) = \frac{P_{y1y2}(\omega) - H_{21}^*(\omega)P_{y1y1}(\omega)}{P_{y2y2}(\omega) - H_{21}^*(\omega)P_{y1y2}(\omega)} \quad (10)$$

If the data satisfies the model of FIG. 1 and if the estimates of $P_{y1y2}(\omega)$ and $P_{y1y2}$ are exact, then the estimate of $H_{12}(\omega)$ will also be exact.

Correspondingly, if $H_{12}(\omega)$ is known, then $$H_{21}(\omega) = \frac{P_{y2y2}(\omega) - H_{12}^*(\omega)P_{y2y2}(\omega)}{P_{y1y1}(\omega) - H_{12}^*(\omega)P_{y1y2}(\omega)} \quad (11)$$

Thus, processor 14 of FIG. 1 can utilize either Equation (10) or (11), where one transfer function component is known, to find the other component, and apply the inverse filter to generate the source signals.

When $H_{21}(\omega)$ equals zero, the solution reduces to the result used in the least mean square (LMS) calculation. As an interesting special case, suppose $H_{21}(\omega)$ is assumed to be zero, i.e. in FIG. 2 there is assumed to be no coupling from $s_2[n]$ to the first output $y_1[n]$. In this case, from (10), $$H_{12}(\omega) = \frac{P_{y1y2}(\omega)}{P_{y2y2}(\omega)} \quad (12)$$

and $$\hat{s}_1[n] = y_1[n] - \hat{h}_{12}[n] * y_2[n] \quad (13)$$

This choice of $H_{12}(\omega)$ is in fact identical to that used in Widrow's least square approach. Specially, it is straightforward to show that if $s_1[n]$ is estimated according to (13), the choice of $H_{12}(\omega)$ as specified in (12) results in $E\{s_1^2[n]\}$ being minimized. The least square approach of Widrow has been extremely successful in a wide variety of contexts. It is also generally understood that some of its limitations derive from the key assumption that $H_{12}(\omega)=0$. Equation (11) suggests a potentially interesting modification of the least square method to incorporate non-zero but specified coupling.

Figure 3:
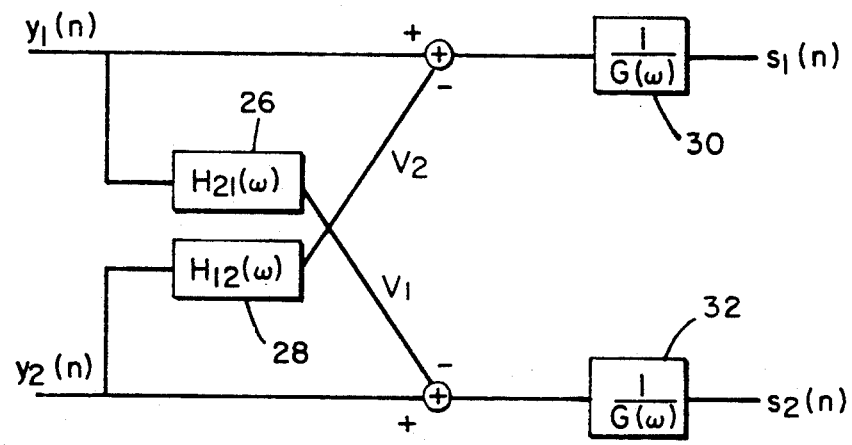
FIG. 3 represents a schematic representation of $H^{-1}$, the inverse of the estimated system of FIG. 2.

FIG. 3 illustrates the inverse of the estimated system of FIG. 2. Reconstruction filter 12 uses an inverse filter to reconstruct source signals $s_1$ and $s_2$. Detected first observed signal, $y_1$, is passed through system $H_{12}$ to yield $U_2$. The other observed signal $y_2$ is passed through a filter $H_{21}$ to yield a signal $U_1$. Then, $U_2$ is subtracted from $y_2$, $U_2$ is subtracted from $y_1$, and each of the resulting difference signals which are $V_1$ and $V_2$, respectively, are passed through another system, $1/G$ to yield the reconstructed source signals $s_1$ and $s_2$. If the original system is not comprised of finite impulse response filters FIRs, both system components cannot be determined. One component must be assumed and the other solved.

Figure 4:
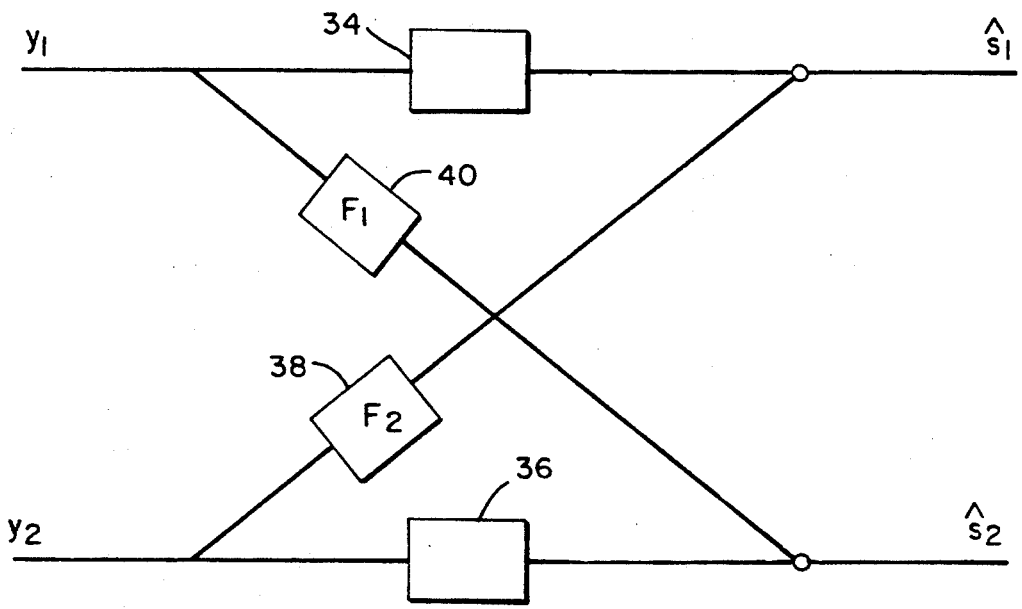
FIG. 4 represents another schematic representation of a possible reconstruction system.

FIG. 4 illustrates a reconstruction filter where the cross transform components, 38 and 40, are FIRs. As will be discussed in detail below, this permits the concurrent calculation of both cross components.

If both $H_{12}(\omega)$ and $H_{21}(\omega)$ are unknown, we then need to jointly estimate them. As already indicated, imposing the assumption that the signals are uncorrelated is insufficient to uniquely solve the problem. In order to obtain a unique solution, we must incorporate additional assumptions concerning the underlying model.

One possibility is to assume statistical independence between $s_1[n]$ and $s_2[n]$. If the signals are not jointly Guassian, this is a stronger condition than the assumption that the signals are statistically uncorrelated. By imposing statistical independence between the estimated signals, additional constraints on the high order moments of $s_1[n]$ and $s_2[n]$ are obtained, that can be used to specify a unique solution for both filters.

II. Estimation Based on Decorrelation and an FIR Constraint

Another class of constraints leading to a unique solution for $H_{12}(\omega)$ and $H_{21}(\omega)$ is comprised of restricting the two linear filters to be causal and finite impulse response (FIR) with a pre-specified order.

Figure 9:
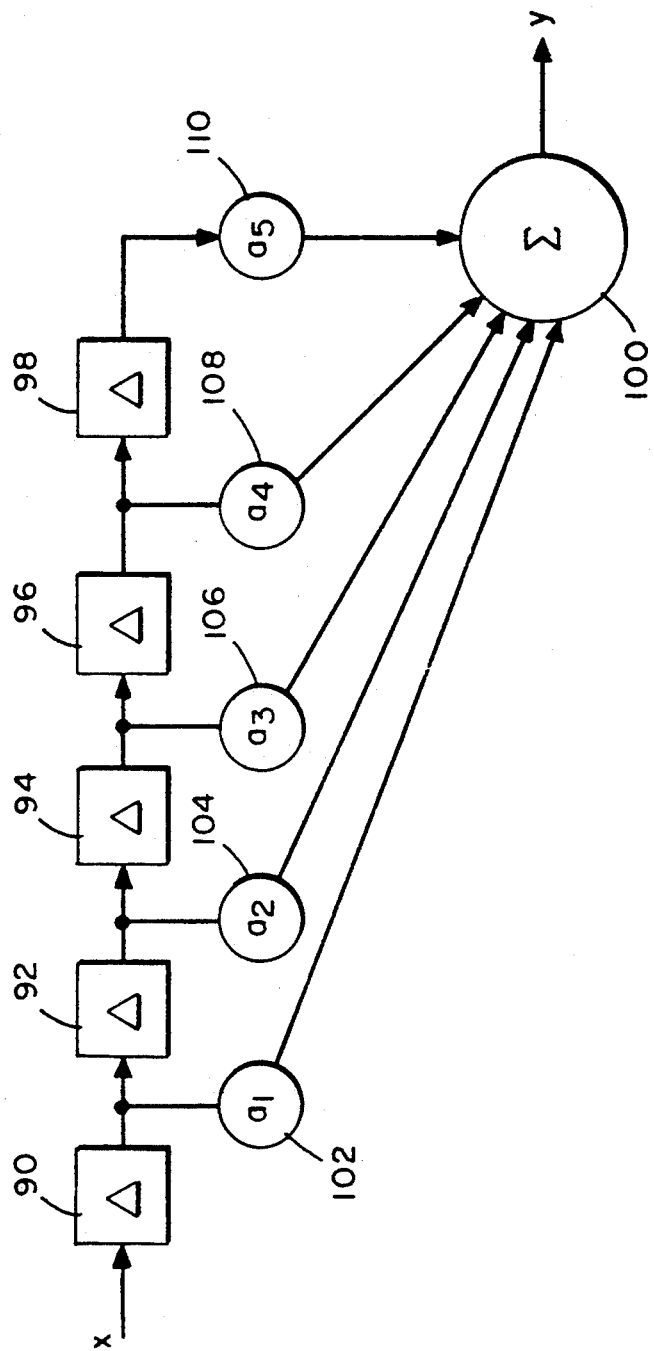
FIG. 9 illustrates a tapped delay line.

As explained below, both $h_{12}$ and $h_{21}$ can be represented as tapped delay lines with filter coefficients $a_n$ and $b_n$, respectively. FIG. 9 illustrates a tapped delay line which can be used as an FIR filter. The line consists of a plurality of delays 90, 92, 94, 96, and 98. The output of each delay is multiplied by a respective coefficient a1 to a5. This multiplication occurs in multipliers 102, 104, 106, 108, and 110. The outputs of the multipliers are added by summer 100 to produce an output signal y.

Consider $h_{12}[n]$ and $h_{21}[n]$ to be FIR filters and, thus, of the form $$h_{12}[n] = \begin{cases} a_n & 0 \leq n \leq q_1 - 1 \\ 0 & \text{otherwise} \end{cases} \quad (14)$$

$$h_{21}[n] = \begin{cases} b_n & 0 \leq n \leq q_2 - 1 \\ 0 & \text{otherwise} \end{cases} \quad (15)$$

The filter coefficients $\{a_n\}$ and $\{b_n\}$ are known and the filter lengths $q_1$ and $q_2$ are assumed known. Since we now have $(q_1+q_2)$ unknowns, Equation (8) or its equivalent in the time domain should, in principle, provide a sufficient number of (nonlinear) equations in the unknown filter coefficients to obtain a unique solution. In the following discussion, a specific time domain approach to obtaining the filter coefficients is developed. As noted above, the inverse system $H^{-1}(w)$ as given by Equation (6) is represented by the block diagram in FIG. 3, where $G(w)=1-H_{12}(w)H_{21}(w)$. The FIG. 3 parameters, $v_1(n)$, $v_2(n)$, and $g_n$, are defined as follows:

$$\begin{aligned} \hat{v}_1(n) &= y_1(n) - \hat{h}_{12}(n) * y_2(n) \\ &= y_1(n) - \hat{a}_n * y_2(n) \end{aligned} \quad (16)$$

$$\begin{aligned} \hat{v}_2(n) &= y_2(n) - \hat{h}_{21}(n) * y_1(n) \\ &= y_2(n) - \hat{b}_n * y_1(n) \end{aligned} \quad (17)$$

and $$\begin{aligned} \hat{g}_n &= \delta_n - \hat{h}_{12}(n) * \hat{h}_{21}(n) \\ &= \delta_n - \hat{a}_n * \hat{b}_n \end{aligned} \quad (18)$$

where $\delta_n$ is the Kroneker delta function. With these definitions, the equations for the signal estimates are given by:

$$g_n * s_1(n) = v_1(n) \quad (19)$$

$$g_n * s_2(n) = v_2(n) \quad (20)$$

From FIG. 3 (or Equations (16) and (17)), Equation (8) can be rewritten in either of the following two forms:

$$H_{12}(\omega) = \frac{P_{y_1v_2}(\omega)}{P_{y_2v_2}(\omega)} \quad (21)$$

$$H_{21}(\omega) = \frac{P_{y_2v_1}(\omega)}{P_{y_1v_1}(\omega)} \quad (22)$$

where $P_{y_iv_j}(\omega)$ i,j=1,2 is the cross spectrum between $y_i(n)$ and $v_j(n)$.

Equivalently in the time (lag) domain we obtain:

$$a_n * c_{y_2v_2}(n) = c_{y_1v_2}(n)(\omega) \quad (23)$$

$$b_n * c_{y_1v_1}(n) = c_{y_2v_1}(n)(\omega) \quad (24)$$

where $c_{y_iv_j}(k)$ is the covariance function between $y_i(n)$ and $v_j(n)$, i.e., $$c_{y_iv_j}(n) = E\{y_i(k)v_j^+(k-n)\} - E\{y_i(k)\}E^+\{v_j(k-n)\} \quad (25)$$
$$i,j = 1,2$$

and $+$ denotes complex conjugation.

Under the assumption that $s_i(t)$ i=1,2 are zero means then $y_i(t)$ and $v_j(t)$ i,j=$\frac{1}{2}$ are also zero means, in which case the second term on the right side of Equation (30) to be discussed below, equals zero, and $c_{y_iv_j}(n)$ is a correlation function. Otherwise, the covariance must be computed.

Expressing (23) for $n=0,1,2\ldots,(q_1-1)$ in a vector form $$C_{y_2v_2}(b)a = c_{y_1v_2}(b) \quad (26)$$

where

-continued $$\hat{a} = \begin{bmatrix} \hat{a}_0 \\ \hat{a}_1 \\ \vdots \\ \hat{a}_{q_1-1} \end{bmatrix} \quad (27)$$

$$\hat{b} = \begin{bmatrix} \hat{b}_0 \\ \hat{b}_1 \\ \vdots \\ \hat{b}_{q_2-1} \end{bmatrix} \quad (28)$$

Similarly, expressing (24) for $n=1/2/\ldots,(q_1-1)$ in vector form $$C_{y_1v_1}(a)b = c_{y_2v_1}(a) \quad (29)$$

Thus, for a pre-specified b, the solution to a is given by $$a = C_{y_2v_2}^{-1}(b)c_{y_1v_2}(b) \quad (30)$$

and for a pre-specified a, the solution to b is given by $$b = C_{y_1v_1}^{-1}(a)c_{y_2v_1}(a) \quad (31)$$

If $b=0$ is substituted in (30), we obtain the least squares estimate of a (under the assumption that in fact $b=0$). Equation (30) therefore suggests a modification to the least squares solution in the FIR case, that incorporates situations in which b is non-zero.

To estimate a or b from the observed data, we replace the covariances in Equations (30) and (31) with their sample estimates. Specifically, the expectations are approximated by the empirical averages:

$$C_{y_2v_2}(b) \approx \frac{1}{\sum_{k=1}^{n} \beta^{n-k}} \sum_{k=1}^{n} \beta^{n-k} v_2^+(k) y_2^T(k) \quad (32)$$

$$c_{y_1v_2}(b) \approx \frac{1}{\sum_{k=1}^{n} \beta^{n-k}} \sum_{k=1}^{n} \beta^{n-k} v_2^+(k) y_1^T(k) \quad (33)$$

$$C_{y_1v_1}(a) \approx \frac{1}{\sum_{k=1}^{n} \alpha^{n-k}} \sum_{k=1}^{n} \alpha^{n-k} v_1^+(k) y_1^T(k) \quad (34)$$

$$c_{y_2v_1}(a) \approx \frac{1}{\sum_{k=1}^{n} \alpha^{n-k}} \sum_{k=1}^{n} \alpha^{n-k} v_1^+(k) y_2^T(k) \quad (35)$$

where $\alpha$ and $\beta$ are real numbers between 0 and 1. to achieve maximal statistical stability, we chose $\alpha=\beta=1$. If, however, the signal and/or the unknown parameters exhibit non-stationary behavior in time, it is preferable to choose $\alpha, \beta < 1$. In this way, exponential weighting can be introduced so that the signal and parameter estimates depend more heavily on the current data samples, and in effect an adaptive algorithm is created that is capable of tracking the time-varying characteristics of the underlying system.

The form of the empirical averages in (32) and (33) suggests solving (30) recursively. Using $$Q(n) = \left[ \sum_{k=1}^{n} \beta^{n-k} v_2^+(k) y_2^T(k) \right]^{-1} \quad (36)$$

$$= [\beta Q^{-1}(n-1) + v_2^+(n) y_2^T(n)]^{-1}$$

$$= \frac{1}{\beta} \left[ Q(n-1) - \frac{Q(n-1)v_2^+(n)y_2^T(n)Q(n-1)}{\beta + y_2^T(n)Q(n-1)v_2^+(n)} \right]$$

and $$q(n) = \sum_{k=1}^{n} \beta^{n-k} v_2^+(k) y_1(k) \quad (37)$$

$$= \beta q(n-1) + v_2^+(n) y_1(n)$$

$\hat{a}(n)$, the estimate of a based on data to time n, can be defined as $$\hat{a}(n) = Q(n)q(n) \quad (38)$$
$$= Q(n)[\beta q(n-1) + v_2^+(n)y_1(n)]$$
$$= Q(n)[\beta Q^{-1}(n-1)\hat{a}(n-1) + v_2^+(n)y_1(n)]$$
$$= Q(n)\left\{ \beta \cdot \frac{1}{\beta} [Q^{-1}(n) - v_2^+(n)y_2^T(n)]\hat{a}(n-1) + v_2^+(n)y_1(n) \right\}$$
$$= \hat{a}(n-1) + Q(n)[v_2^+(n)y_1(n) - v_2^+(n)y_2^T(n)\hat{a}(n-1)]$$
$$= \hat{a}(n-1) + Q(n)v_2^+(n)[y_1(n) - y_2^T(n)\hat{a}(n-1)]$$
$$= \hat{a}(n-1) + Q(n)v_2^+(n)v_1(n|n-1)$$

where $$v_1(n|n-1) = y_1(n) - y_2^T(n)a(n-1) \quad (39)$$

Similarly, the solution to (31) can be computed recursively as follows:

$$\hat{b}(n) = \hat{b}(n-1) + R(n)v_1^+(n)v_2(n|n-1) \quad (40)$$

$$R(n) = \frac{1}{\alpha} \left[ R(n-1) - \frac{R(n-1)v_1^+(n)y_1^T(n)R(n-1)}{\alpha + y_1^T(n)R(n-1)v_1^+(n)} \right] \quad (41)$$

where $$R(n) = \left[ \sum_{k=1}^{n} \beta^{n-k} v_1^+(k) y_1^T(k) \right]^{-1} \quad (42a)$$

and $$v_2(n|n-1) = y_2(n) - y_1^T(n)b(n-1) \quad (42b)$$

If $b=0$, then (38) becomes the well-known recursive least squares (RLS) solution of the least squares problem. Thus, (38) can be viewed as a generalization of the RLS solution to a when b is specified and not restricted to be zero. Similarly, (40) is a generalized RLS algorithm for obtaining b when a is specified and not restricted to be zero. Time domain solution scan also be adequately handled by tapped delay line methods.

At times, both a and b are unknown vector parameters to be estimated. The form of (30) and (31) suggests the following iterative algorithm:

$$a^{(l)} = C_{y2v2}^{-1}(b^{(l-1)})c_{y1v2}(b^{(l-1)}) \quad (43)$$

$$b^{(l)} = C_{y1v1}^{-1}(a^{(l-1)})c_{y2v1}(a^{(l-1)}) \quad (44)$$

where $a^{(l)}$ and $b^{(l)}$ are, respectively, the estimates of a and b after l iteration cycles. To implement the algorithms, we use the empirical averages given in Equations (32)-(35). Of course, for a given $b^{(l-1)}$, $a^{(l)}$ may be computed recursively in time using (38). Similarly, for a given $a^{(l-1)}$, $b^{(l)}$ may be computed using (40).

Figure 5A:
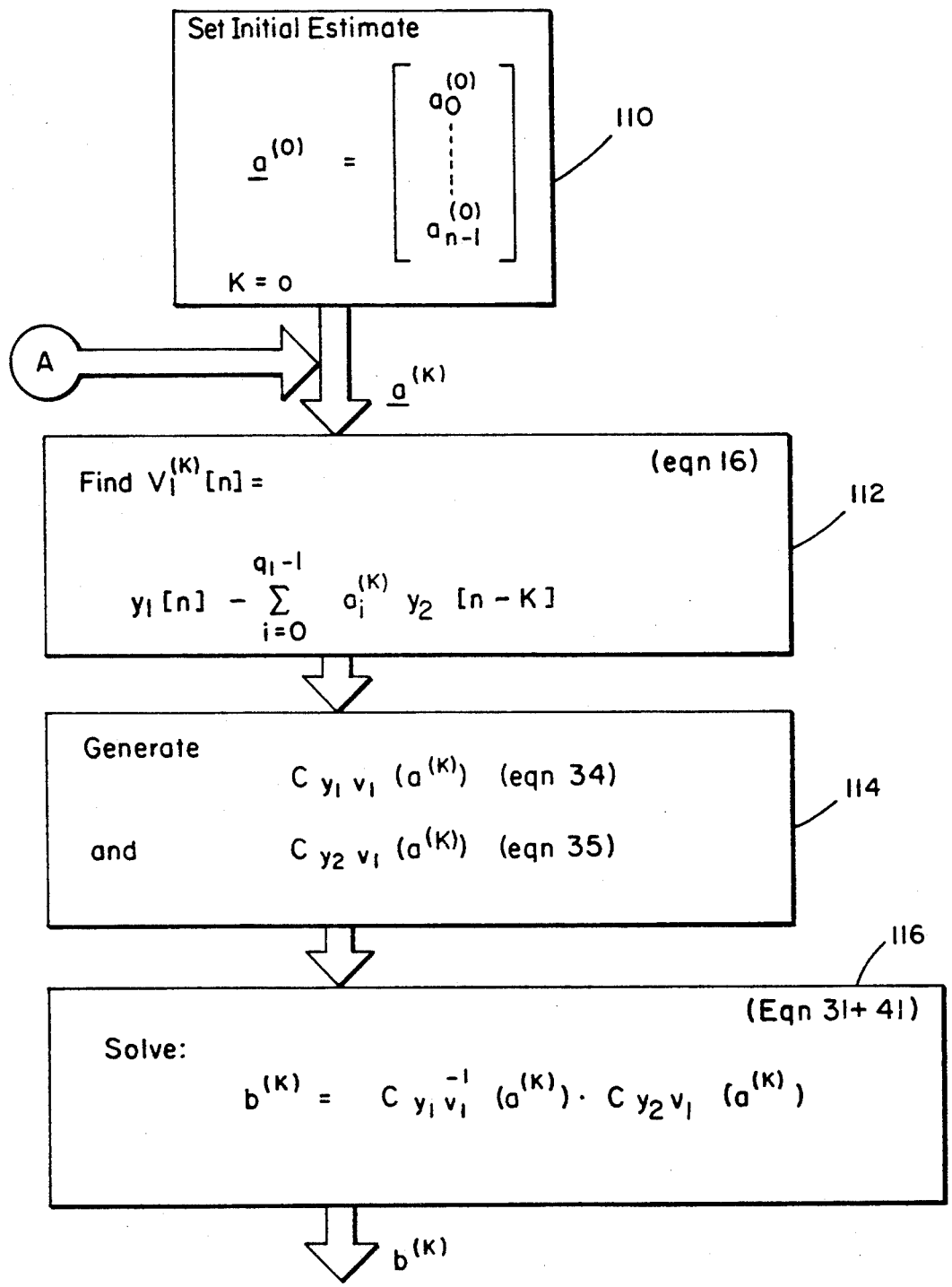
FIGS. 5A-5C illustrate an embodiment of the signal processing system that implements an iterative process for estimating the coupling systems.
Figure 5B:
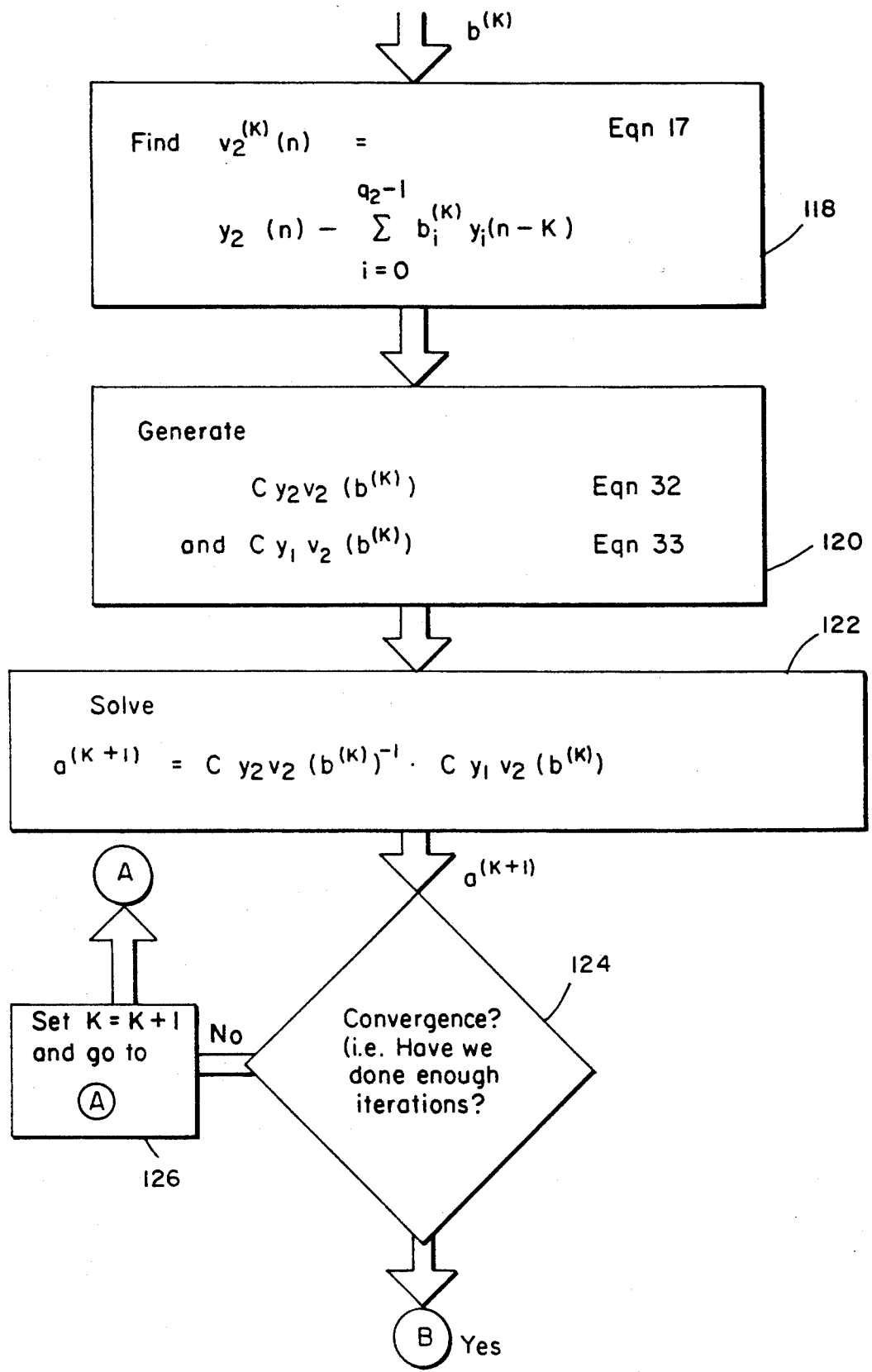
Figure 5C:
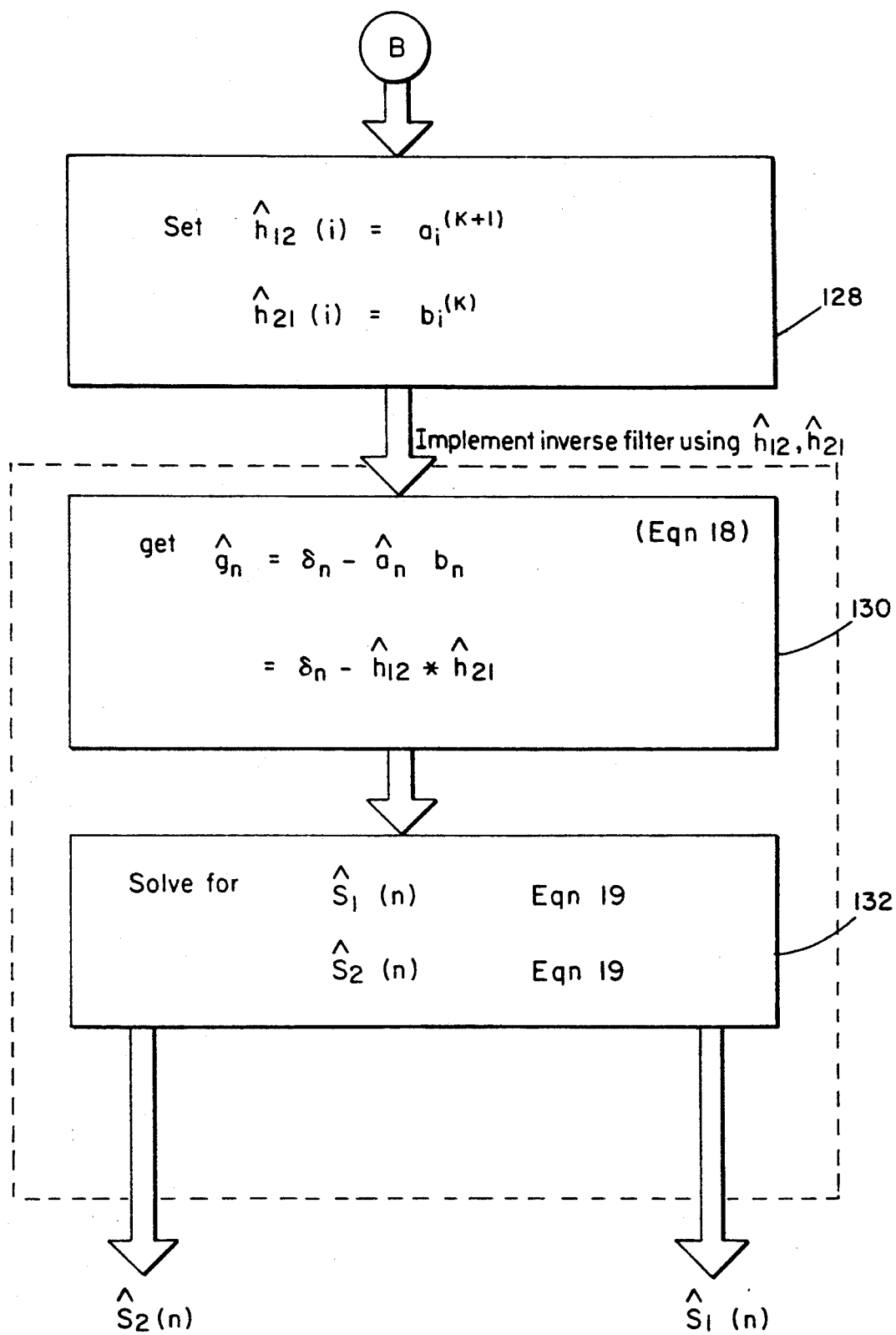

This iterative process is shown in the embodiment of FIG. 5. To obtain a fully recursive algorithm, we suggest incorporating (38) with (39), where in the recursion for estimating a, b(n) is substituted for $b^{(l)}$, and in the recursion for estimating b, a(n) is substituted for $a^{(l)}$. Note that replacing the iteration index by the time index is a common procedure in stochastic approximation.

Thus, as an alternative to (43) and (44), the following iterative procedure is used to solve (26) and (29):

$$a^{(l)} = a^{(l-1)} + \gamma_1^{(l)}[c_{y1v2}(b^{(l-1)}) - c_{y2v2}^{-1}(b^{(l-1)}) a^{(l-1)}] \quad (45)$$

$$b^{(l)} = b^{(l-1)} + \gamma_2^{(l)}[c_{y2v1}(a^{(l-1)}) - c_{y1v1}^{-1}(a^{(l-1)}) b^{(l-1)}] \quad (46)$$

where $\gamma_1^{(l)}$ and $\gamma_2^{(l)}$ are constant gains (step sizes) that may depend on the iteration index. This algorithm can be viewed as an iterative gradient search algorithm for solving (26) and (29).

Using, $$c_{y1v2}(b) - C_{y2v2}^{-1}(b)a = E\{v_2^+(n)v_1(n)\} \quad (47)$$

$$c_{y2v1}(a) - C_{y2v2}^{-1}(a)b = E\{v_1^+(n)v_2(n)\} \quad (48)$$

Then, using the first order stochastic approximation method, replace expectation by current realization, and iteration index by the time index to obtain the following sequential algorithm:

$$a(n)=a(n-1)+\gamma_1(n)\cdot v_2^+(n/n-1)v_1(n/n-1) \quad (49)$$

$$b(n)=b(n-1)+\gamma_2(n)\cdot v_1^+(n/n-1)v_2(n/n-1) \quad (50)$$

where $v_1^+(n/n-1)$ is the vector defined in (39) computed using $a=a(n-1)$, and $v_2^+(n/n-1)$ is the vector defined using $b=b(n-1)$.

The flow chart in FIG. 5 illustrates the adaptive sequential algorithm which estimates a (i) and b (i) recursively using Equations (49) and (50), then generating $v_1$ (i) and $v_2$ (i) according to Equations (16) and (12) and finally generating $s_1$ and $s_2$ according to Equations (19) and (20), respectively. Block 110 illustrates the setting of the initial estimate of a. As shown in block 112, $v_1$ is calculated using the initial a values and the detected signals, $y_1$ and $y_2$, in accordance with Equation (16). The value $v_1$ is used to perform the calculations shown in block 114 in FIG. 5(a). According to Equations (34) and (35), values are calculated for $c_{y1v1}$ and $c_{y2v1}$. Next the values for b are calculated using Equations (31) and (41) as shown in block 116. The values for b are then used to find $v_2$ in accordance with Equation (17) as shown by block 118. Using this value, Equations (32) and (33) are used to calculate $C_{y2v2}$ and $c_{y1v2}$ as shown in block 120. Next, values are found for $A^{(k+1)}$. Block 124 determines whether convergence has occurred. If more iterations need to be calculated, k is set equal to k+1 and calculation are restarted in block 112. If conversion has occurred, the values for $a^{(k+1)}$ are set equal to the estimate for $H_{12}$. Also in block 128, the calculated values for $b_i$ are set equal to the estimate for the transform $H_{21}$. The final calculations are made as shown in block 130 and 132. As shown in block 130, $g_n$ is calculated using Equation (18) and, finally estimates are made for the reconstructed output signals $s_1$ and $s_2$ using Equations (19) and (20), respectively.

Figure 6:
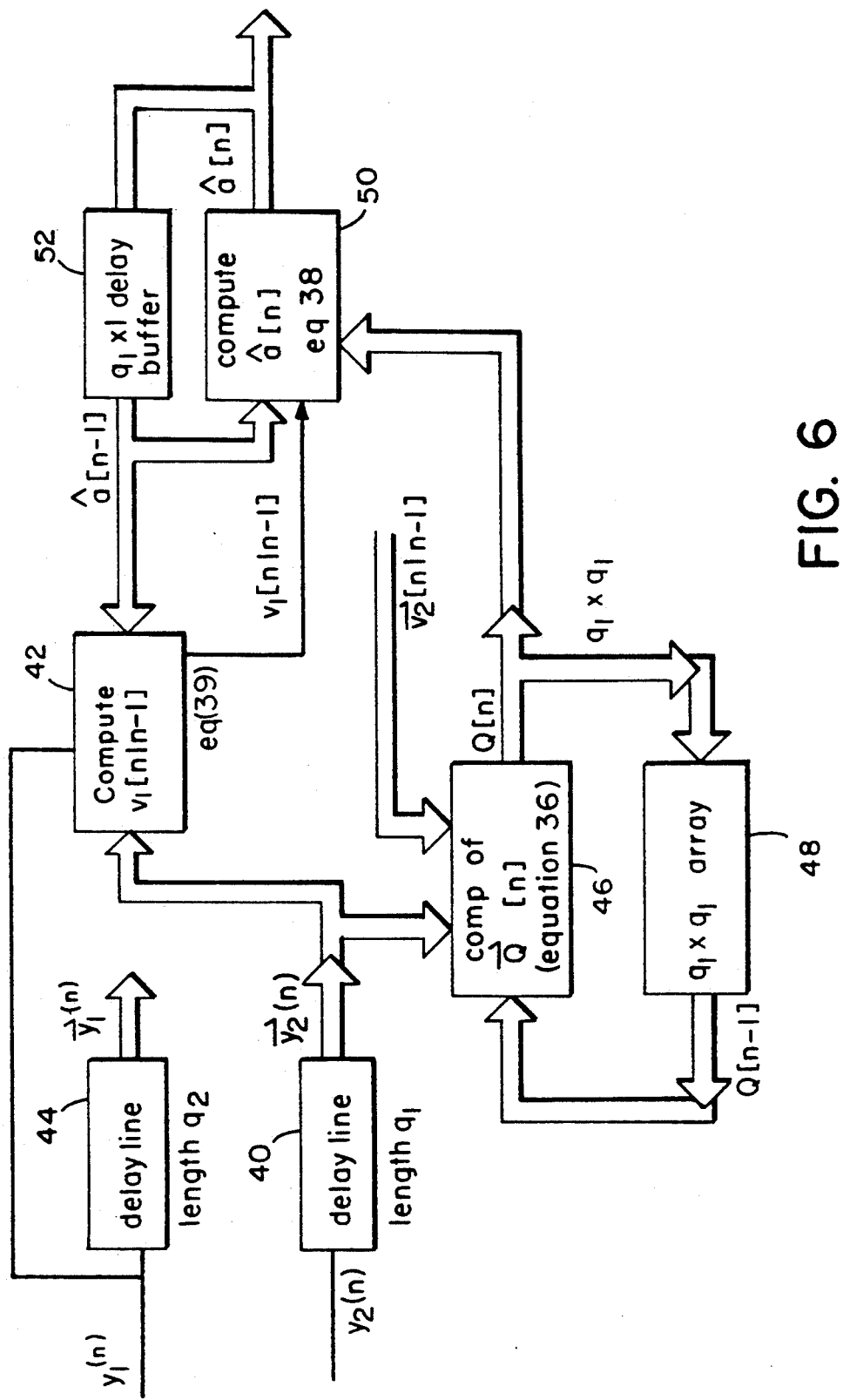
FIG. 6 illustrates an embodiment of the signal processing system that implements an adaptive sequential algorithm for estimating the coupling systems.

FIG. 6 illustrates an embodiment of the signal processing system that implements the adaptive sequential algorithm of the flow chart of FIG. 5. Detected signals $y_1$ and $y_2$ are delayed. Delay line 44 with a length $q_2$ delays detected signal $y_1$ and delay line 46 with the length $q_1$ delays the detected signal $y_2$. In block 42, values for $v_1$ (n/n−1) are calculated in accordance with Equation (39). Blocks (46) and (48) are used to calculate Q(n) in accordance with Equation (36). Values for the estimated filter coefficients a are calculated in accordance with Equation (38) by using the outputs of boxes 42 and 46. The values for a(n), as calculated by the processor of FIG. 6, are used to update the reconstruction filter 12 of FIG. 1. A similar process is used to calculate the values of filter coefficients b. Thus, updated reconstructed output signals can be derived. It should be noted that this embodiment represents a class of algorithms where the adaptive techniques can be varied to make a smooth estimate of several components of $v_1$ and $v_2$.

By assuming the reconstructed outputs are decorrelated, no assumptions need be made regarding the observed signal. If one transfer component, for example $H_{12}$, is known, then the other transfer component $H_{21}$ can be estimated. The criterion of decorrelated reconstructed signal outputs can be used with several other assumptions. For example, the generating system transfer components $H_{12}$ and $H_{21}$ can have finite impulse responses. Then the inverse filter for the generating system can be calculated. In another example, the reconstruction filter can have a finite impulse response. If either $H_{21}$ or $H_{12}$ are known, then the other can be calculated and reconstructed output signals developed. Also, only partial knowledge of the transfer components is needed to accurately calculate the reconstruction filter. Thus, if either the phase or magnitude of the filter components is known, the other parameter can be calculated and the reconstruction filter completely described. These examples are not limiting, but merely representative of some of the contexts in which the signal processing device of the invention can be used.

The reconstruction filter with some parameters unknown can also be updated or modified with time variant data by forcing the output to be decorrelated. Thus, the algorithm can be adaptive in time and sequential, i.e. updated as more data is obtained. The algorithms can also be used in concurrent processing.

Figure 7:
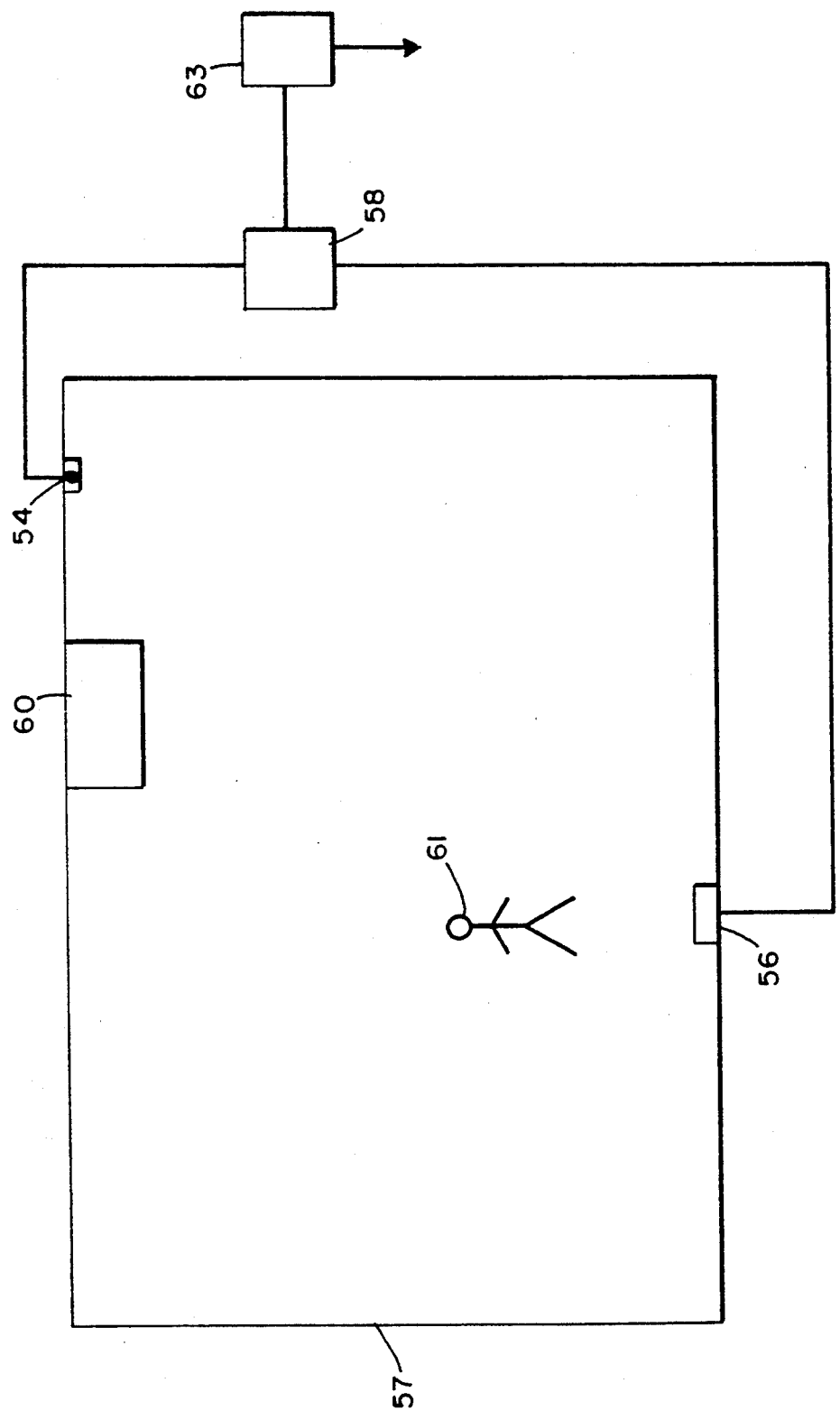
FIG. 7 illustrates a speech enhancing and noise cancellation system using the signal processing circuit of the invention.

FIG. 7 illustrates the preferred use of the invention in a speech enhancing and noise cancellation system. The separation of voice signals from interfering noise signals in a room can be easily accomplished using the signal processing device of the invention. For example, FIG. 7 illustrates an individual 61 in room 57. Also in the room is a communications device 60 such as a TV or a radio. Microphone 54 is located near the noise source 60. Microphone 56 is near the desired signal source from the individual 61. Due to the room acoustics, both signals are picked up by both microphones. The processing and reconstruction device 58 operates on the detected signals in accordance with the principles described above. Thus, the desired signal from source 61 can be derived without interfering reverberation being caused by the processing. The desired signal reconstructed from device 58 can then be processed by a speech recognition device 63.

The signal separator of the invention can also be used in a moving vehicle, such as a car. A microphone can be located near the muffler and another microphone near the speaker. The speaker's microphone could be a car phone. The noise caused by the muffler can be eliminated by using the signal separator of the invention. Moreover, since some of the generating transfer functions are known or can be calculated from the car acoustical environment, calculations can be simplified in the reconstruction filter.

Figure 8:
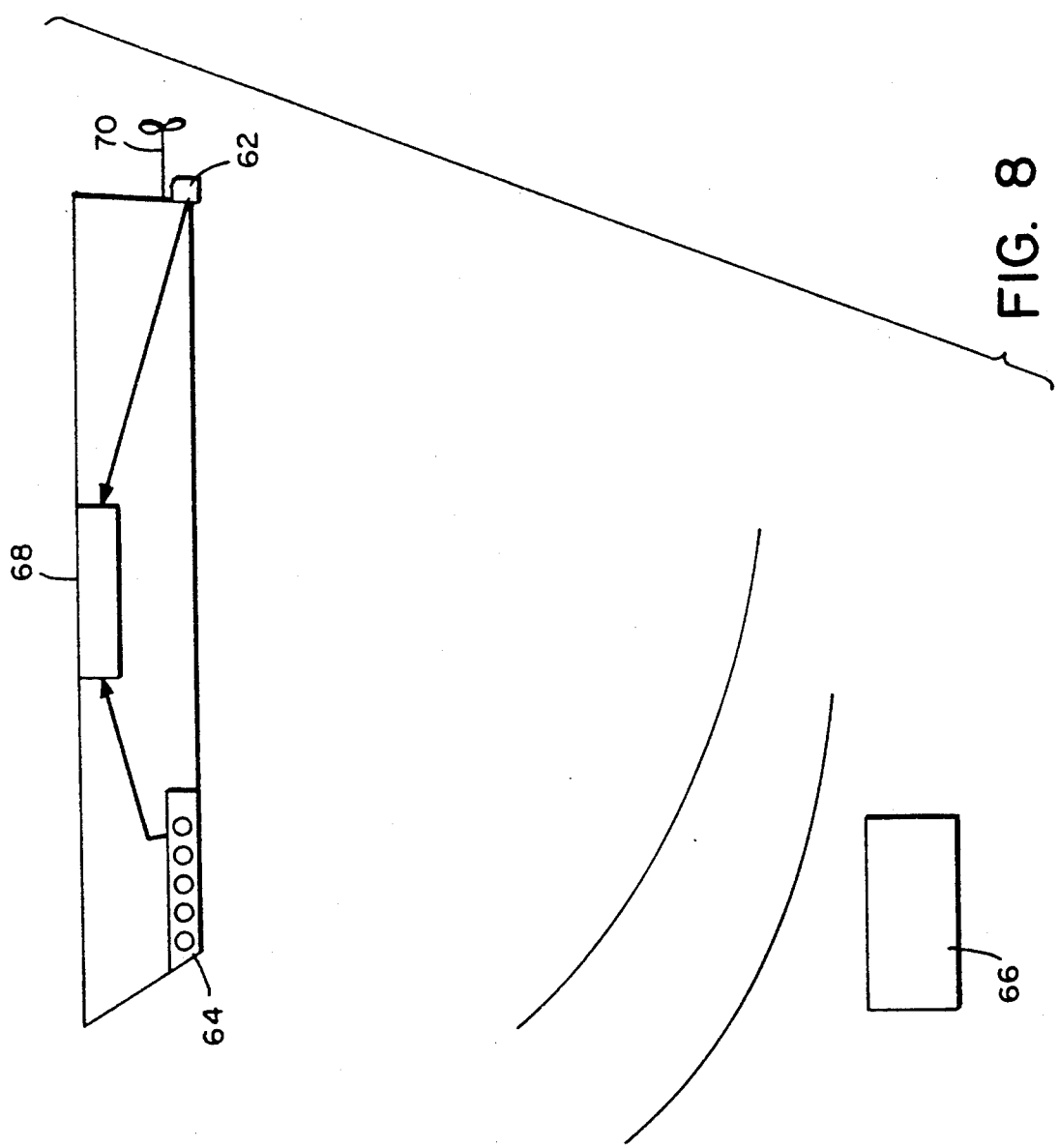
FIG. 8 illustrates a signal enhancing system in an underwater acoustic environment.

FIG. 8 illustrates a signal enhancing system in accordance with the invention in an underwater acoustic environment. A sonar array 64 is used to determine the position of target 66. Noise generated by propeller 70 interferes with this determination. Accordingly, microphone 62 generates an output signal which is processed with the signals from array 64 by signal separation device 68. Thus, despite the leakage of sonar signals from array 64 to microphone 62, an accurate target signal can be calculated.

Although speech processing is the preferred application of the invention, the signal processing device can be applied in many fields. For example, noise cancellation in a telemetry system can be effected by means of the signal enhancement device. Electrical signals from the human body, such as those processed in an electrocardiogram, can be more accurately determined by means of the invention. Also, antenna signals can be more accurately determined by means of the invention.

EQUIVALENTS

Those skilled in the art will recognize, or be able to ascertain, using no more than routine experimentation, many equivalents to the specific embodiments of the invention described herein.

These and all other equivalents are intended to be encompassed by the following claims.

We claim:

1. A signal processing system comprising:
   a plurality of detectors for detecting source signals subjected to a generating system transfer function;
   a processor for receiving the detected signals and producing a reconstruction filter for filtering the detected signal to produce reconstructed source signals, the reconstruction filter being produced such that correlation between reconstructed source signals is forced to approach zero even when each detector receives source signals from plural sources; and
   said reconstruction filter for receiving the detected signals to generate a reconstruction of the various source signals without interference from any of the other source signals.

2. A signal processing system, as recited in claim 1, wherein the reconstruction filter is inversely related to said transfer function.

3. A signal processing system, as recited in claim 2, wherein some of the transfer function parameters are known.

4. A signal processing system, as recited in claim 2, wherein none of the transfer function parameters are known and the transfer function has a finite impulse response.

5. A signal processing system, as recited in claim 4, wherein the reconstruction filter is adjusted iteratively.

6. A signal processing system, as recited in claim 4, wherein the reconstruction filter is adaptive.

7. A signal processing system, as recited in claim 1, wherein the reconstruction filter has a finite impulse response.

8. A signal processing system comprising:
   a first detector for receiving at least one source signal subjected to a generating system transfer function;
   a second detector for receiving at least one source signal subjected to said generating system transfer function;
   a reconstruction filter including a first transfer function to which a first signal from the first detector is applied and a second transfer function to which a second input signal from the second detector is applied, the output of the first transfer function being subtracted from the second input signal and the output of the second transfer function being subtracted from the first input signal;
   such that the reconstruction filter for filtering the first and second signals produce reconstructed first and second source signals with a correlation that is forced to approach zero even when each detector receives source signals from plural sources.

9. A signal processing system, as recited in claim 8, wherein the first and second transfer function are tapped delay lines with a plurality of equal delay segments, the output of each delay segment is multiplied by a filter coefficient, and the filter coefficient outputs for the respective delay segments are summed to serve as outputs for the first and second transfer functions.

10. A signal processing system, as recited in claim 9, wherein the reconstruction filter is inversely related to said transfer function.

11. A signal processing system, as recited in claim 10, wherein some filter coefficients are known.

12. A signal processing system, as recited in claim 10, wherein none of the filter coefficients are known and the generating system transfer function has a finite impulse response.

13. A signal processing system, as recited in claim 12 wherein the reconstruction filter is adjusted iteratively.

14. A signal processing system, as recited in claim 12, wherein the reconstruction filter is adaptive.

15. A signal processing system, as recited in claim 8, wherein the reconstruction filter has a finite impulse response.

16. A method of multichannel source signal separation, wherein said source signals are subjected to a transfer function, comprising the steps of:
    detecting a plurality of observed signals from at least one source signal subjected to the transfer function; and
    processing the detected signals and producing a reconstruction filter for filtering the detected signal to produce reconstructed source signals such that the correlation between the various reconstructed source signals is forced to approach zero even when each observed signal receives source signals from plural sources.

17. A method, as recited in claim 16, wherein the reconstruction filter is inversely related to said transfer function.

18. A method, as recited in claim 17, wherein some of the transfer function parameters are known.

19. A method, as recited in claim 17, wherein none of the transfer function parameters are known and the transfer function has a finite impulse response.

20. A method, as recited in claim 19, wherein the reconstruction filter is adjusted iteratively.

21. A method, as recited in claim 19, wherein the reconstruction filter is adaptive.

22. A method, as recited in claim 16, wherein the reconstruction filter has a finite impulse response.

23. A signal processing system, for reconstructing first source signal $S_1$ and a second source signal $S_2$ which are subjected to a generating transfer function, comprising
   (a) a first detector which produces a first observed signal $y_1$ from at least one source signal subjected to said transfer function;
   (b) a second detector which produces a second observed signal $y_2$ from at least one source signal subjected to said transfer function;
   (c) a reconstruction filter including:
      (i) a first filter $H_{21}$ which processes the first observed signal $y_1$ and produces a first output signal $U_1$,
      (ii) a second filter $H_{12}$ which processes the second observed signal $y_2$ and produces a second output signal $U_2$,
      (iii) a first subtractor which subtracts $V_2$ from $Y_1$ to produce $V_1$,
      (iv) a second subtractor which subtracts $U_1$ from $Y_2$ to produce $V_2$,
      (v) a processing transform which converts the signals $V_1$ and $V_2$, respectively, into reconstructed source signals, $S_1$ and $S_2$, respectively, wherein the correlation between the reconstructed source signals is forced to approached zero, even when each detector receives source signals from plural sources.

24. A system, as recited in claim 23, wherein the reconstruction filter is inversely related to said transfer function.

25. A system, as recited in claim 24, wherein some of the transfer function parameters are known.

26. A system, as recited in claim 24, wherein none of the transfer function parameters are known and the transfer function has a finite impulse response.

27. A system, as recited in claim 26, wherein the reconstruction filter is adjusted iteratively.

28. A system, as recited in claim 26, wherein the reconstruction filter is adaptive.

29. A system, as recited in claim 23, wherein the reconstruction filter has a finite impulse response.

30. A system for enhancing speech in a noise environment, where both the speech and noise are subjected to a generating system transfer function, comprising:
   a first microphone near a speaker which produces a first observed signal $y_1$, including at least one of speech and noise components,
   a second microphone near a noise source which produces a second observed signal $Y_2$, including at least one of speech and noise components,
   a processor for receiving the first and second observed signals, $y_1$ and $y_2$, and producing a reconstruction filter for filtering the detected signals to produce reconstructed source signals,
   said reconstruction filter producing separate reconstructed speech and noise signals such that the correlation between the reconstructed signals is forced to approach zero even when each microphone detects both speech and noise components.

31. A system, as recited in claim 30, further comprising a speech recognition device coupled to said reconstruction filter.

32. A system, as recited in claim 30, wherein the reconstruction filter is inversely related to the transfer function.

33. A system, as recited in claim 32, wherein some of the transfer function parameters are known.

34. A system, as recited in claim 32, wherein none of the transfer function parameters are known and the transfer function has a finite impulse response.

35. A system, as recited in claim 34, wherein the reconstruction filter is adjusted iteratively.

36. A system, as recited in claim 32, wherein the reconstruction filter is adaptive.

37. A system, as recited in claim 30, wherein the reconstruction filter has a finite impulse response.

38. A signal enhancing system in an underwater acoustic environment, where both a source signal and noise are subjected to a generating system transfer function, comprising
   a sonar array for producing and receiving ultrasonic signals, wherein the received signals represent a plurality of first observed signals $Y_1$-$Y_p$, including at least one of source signal and noise components,
   a microphone near a noise source which produces a second observed signal $Y_2$, including at least one of source signal and noise components,
   a processor for receiving the first and second observed signals $Y_1$—$Y_p$ and $Y_2$, and producing a reconstruction filter for filtering the detected signals to produce reconstructed source signals,
   said reconstruction filter producing separate reconstructed signals where the correlation between the reconstructed signals is forced to approach zero, even when the sonar array and the microphone both detect source signal and noise components.

39. A system, as recited in claim 38, wherein the reconstruction filter is inversely related to the transfer function.

40. A system, as recited in claim 39, wherein some of the transfer function parameters are known.

41. A system, as recited in claim 39, wherein none of the transfer function parameters are known and the transfer function has a finite impulse response.

42. A system, as recited in claim 41, wherein the reconstruction filter is adjusted iteratively.

43. A system, as recited in claim 41, wherein the reconstruction filter is adaptive.

44. A system, as recited in claim 38, wherein the reconstruction filter has a finite impulse response.

* * * * *